United States Patent
Maeda et al.

(10) Patent No.: US 9,576,845 B2
(45) Date of Patent: Feb. 21, 2017

(54) METHOD FOR MANUFACTURING A SEMICONDUCTOR DEVICE INCLUDING A HOLLOW STRUCTURE AROUND AN ELECTRODE OF A SEMICONDUCTOR ELEMENT

(71) Applicant: Mitsubishi Electric Corporation, Tokyo (JP)

(72) Inventors: Kazuhiro Maeda, Tokyo (JP); Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 19 days.

(21) Appl. No.: 14/706,852

(22) Filed: May 7, 2015

(65) Prior Publication Data
US 2016/0042994 A1 Feb. 11, 2016

(30) Foreign Application Priority Data
Aug. 8, 2014 (JP) ................................. 2014-162933

(51) Int. Cl.
*H01L 21/44* (2006.01)
*H01L 21/764* (2006.01)
(Continued)

(52) U.S. Cl.
CPC ......... *H01L 21/764* (2013.01); *H01L 21/7682* (2013.01); *H01L 23/5222* (2013.01); *H01L 23/53295* (2013.01); *H01L 2924/0002* (2013.01)

(58) Field of Classification Search
CPC ............... H01L 21/764; H01L 21/7682; H01L 23/53295; H01L 23/5222
See application file for complete search history.

(56) References Cited

U.S. PATENT DOCUMENTS

2010/0219454 A1 9/2010 Amasuga
2011/0049578 A1 3/2011 Kojima
2013/0076458 A1 3/2013 Katou et al.

FOREIGN PATENT DOCUMENTS

JP 2003-142578 A 5/2003
JP 2010-205837 A 9/2010
(Continued)

OTHER PUBLICATIONS

An Office Action; "The Preliminary Rejection," issued by the Korean Patent Office on Jun. 3, 2016, which corresponds to Korean Patent Application No. 10-2015-0111363 and is related to U.S. Appl. No. 14/706,852; with English language partial translation.
(Continued)

*Primary Examiner* — Stephen W Smoot
*Assistant Examiner* — Vicki B Booker
(74) *Attorney, Agent, or Firm* — Studebaker & Brackett PC

(57) ABSTRACT

A method for manufacturing a semiconductor device includes: forming a semiconductor element having an electrode on a main surface of a semiconductor substrate; forming a first resin film that encloses a side of the electrode while keeping a distance from the electrode of the semiconductor element on the main surface of the semiconductor substrate; and forming a hollow structure around the electrode of the semiconductor element by bonding a second resin film that covers over the electrode while keeping a distance from the electrode of the semiconductor element to a top surface of the first resin film.

11 Claims, 5 Drawing Sheets

(51) Int. Cl.
*H01L 23/522* (2006.01)
*H01L 23/532* (2006.01)
*H01L 21/768* (2006.01)

(56) References Cited

FOREIGN PATENT DOCUMENTS

JP     2011-049303 A     3/2011
KR    2013-0084238 A     7/2013

OTHER PUBLICATIONS

Takayuki Hisaka et al.; "Simultaneous achievement of high performance and high reliability in a 38/77 GHz InGaAs/AlGaAs PHEMT MMIC"; IEICE Electronics Express; vol. 7, No. 8; pp. 558-562, Apr. 2010.

METHOD FOR MANUFACTURING A SEMICONDUCTOR DEVICE INCLUDING A HOLLOW STRUCTURE AROUND AN ELECTRODE OF A SEMICONDUCTOR ELEMENT

BACKGROUND OF THE INVENTION

Field of the Invention

The present invention relates to a method for manufacturing a semiconductor device including a hollow structure around a semiconductor element.

Background Art

Multilayer wiring structures in which resin films and metal wires are repeatedly laminated on one another are used to achieve high integration and downsizing of semiconductor devices. However, the resin films cause parasitic capacitance to increase and cause electric characteristics of the semiconductor devices to deteriorate. In semiconductor devices including Y-type or T-type gate electrodes in particular, space under an overhang of the gate electrode is filled with resin, which increases the parasitic capacitance and causes the high-frequency gain to deteriorate (e.g., see T. Hisaka (1), H. Sasaki (1), T. Katoh (1), K. Kanaya (1), N. Yoshida (1), A. A. Villanueva (2), and J. A. del Alamo (2), IEICE Electronics Express, Vol. 7, No. 8, P. 558-562, (1) Mitsubishi Electric Corporation, (2) Massachusetts Institute of Technology).

In contrast, a method is proposed for forming a hollow structure around a semiconductor element by forming a sacrificial layer and a protective film on a semiconductor element and then removing the sacrificial layer (e.g., see Japanese Patent Application Laid-Open No. 2010-205837 and Japanese Patent Application Laid-Open No. 2011-049303).

Another method is proposed for forming a hollow structure between adjacent wires by laminating a sheet film on a substrate on which a plurality of wires are formed (e.g., see Japanese Patent Application Laid-Open No. 2003-142578). However, since there is no semiconductor element between wires, this method has nothing to do with a semiconductor device including a hollow structure around the semiconductor element.

SUMMARY OF THE INVENTION

Since most of the sacrificial layer is surrounded by a protective film or the like, a contact area between an etching gas or liquid and the sacrificial layer is small when the sacrificial layer is removed by etching. Therefore, the etching gas or the like is less likely to enter micro crevices and etching residues thereby remain. The sacrificial layer is more likely to remain in a minute space under the overhang of the Y-type or T-type gate electrode in particular. As a consequence, there is a problem that parasitic capacitance increases and the high-frequency gain deteriorates.

In view of the above-described problems, an object of the present invention is to provide a method for manufacturing a semiconductor device capable of preventing parasitic capacitance from increasing.

According to the present invention, a method for manufacturing a semiconductor device includes: forming a semiconductor element having an electrode on a main surface of a semiconductor substrate; forming a first resin film that encloses a side of the electrode while keeping a distance from the electrode of the semiconductor element on the main surface of the semiconductor substrate; and forming a hollow structure around the electrode of the semiconductor element by bonding a second resin film that covers over the electrode while keeping a distance from the electrode of the semiconductor element to a top surface of the first resin film.

In the present invention, since no sacrificial layer is used when the hollow structure is formed around of the semiconductor element, there is no cause for concern about etching residue. Therefore, it is possible to prevent parasitic capacitance from increasing.

Other and further objects, features and advantages of the invention will appear more fully from the following description.

DETAILED DESCRIPTION OF THE PREFERRED EMBODIMENTS

A method for manufacturing a semiconductor device according to the embodiments of the present invention will be described with reference to the drawings. The same components will be denoted by the same symbols, and the repeated description thereof may be omitted.

First Embodiment

Figure 1:
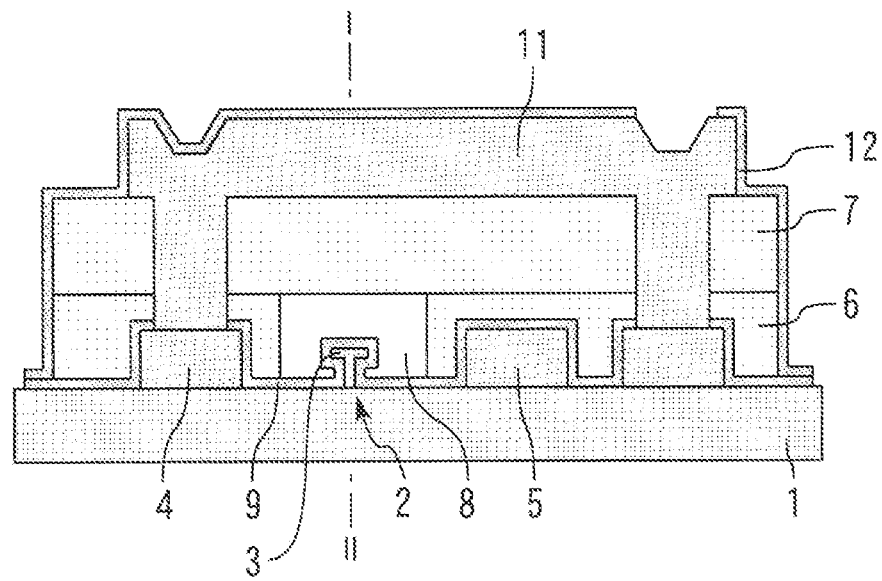
FIG. 1 is a cross-sectional view illustrating a semiconductor device according to a first embodiment of the present invention.
Figure 2:
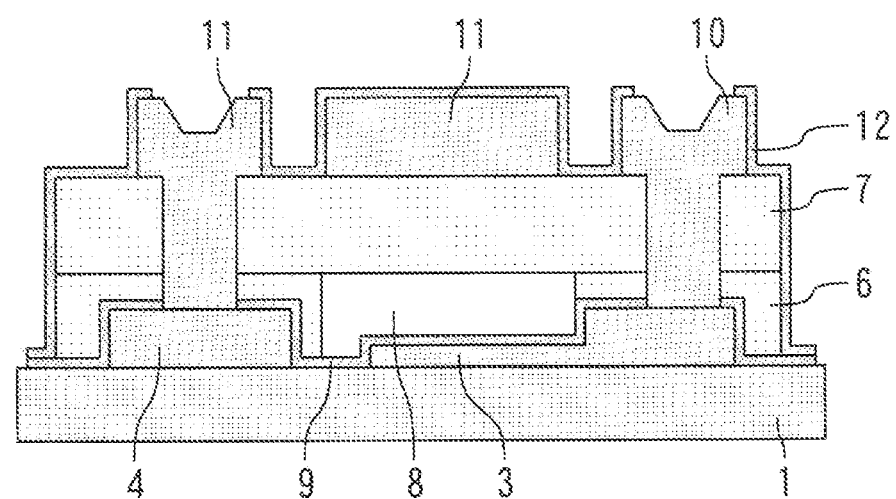
FIG. 2 is a cross-sectional view along a line I-II in FIG. 1.

FIG. 1 is a cross-sectional view illustrating a semiconductor device according to a first embodiment of the present invention. FIG. 2 is a cross-sectional view along a line I-II in FIG. 1. A semiconductor element 2 is formed on a main surface of a semiconductor substrate 1. The semiconductor element 2 is a transistor including a Y-type or T-type gate electrode 3 including an overhang, a source electrode 4 and a drain electrode 5.

A first resin film 6 that encloses the side of the gate electrode 3 while keeping a distance from the gate electrode 3 of the semiconductor element 2 is formed on the main surface of the semiconductor substrate 1. A second resin film 7 that covers over the gate electrode 3 while keeping a distance from the gate electrode 3 of the semiconductor element 2 is bonded to a top surface of the first resin film 6. The material of the first and second resin films 6 and 7 is, for example, BCB, polyimide, PSI or PBO.

A hollow structure 8 is formed around the gate electrode 3 of the semiconductor element 2, the first resin film 6 constituting a side wall and the second resin film 7 constituting a top plate of the hollow structure 8. The hollow structure 8 is also formed under the overhang of the gate electrode 3. A first insulating film 9 having higher moisture resistance than the first and second resin films 6 and 7 covers the semiconductor element 2 inside the hollow structure 8.

Via a through hole provided in the first and second resin films 6 and 7, a gate wiring 10 is connected to the gate electrode 3 and a source wiring 11 is connected to the source electrode 4. The source wiring 11 is also arranged over the gate electrode 3 via the hollow structure 8 and the second resin film 7. A second insulating film 12 having higher moisture resistance than the first and second resin films 6 and 7 covers the outside of the first resin film 6 and the outside of the second resin film 7. The first and second insulating films 9 and 12 are made of, for example, SiN or SiON.

Figure 3:
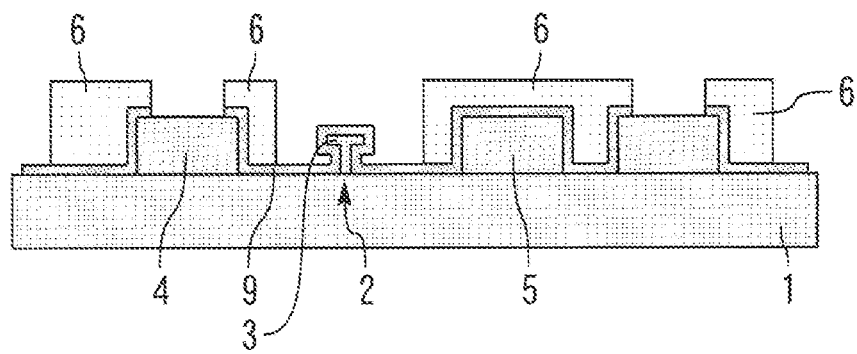
FIGS. 3 to 5 are cross-sectional views illustrating the manufacturing steps of the semiconductor device according to the first embodiment of the present invention.
Figure 4:
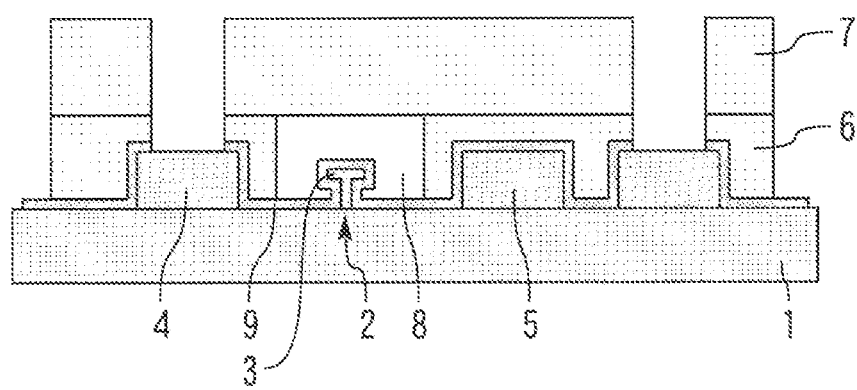
Figure 5:
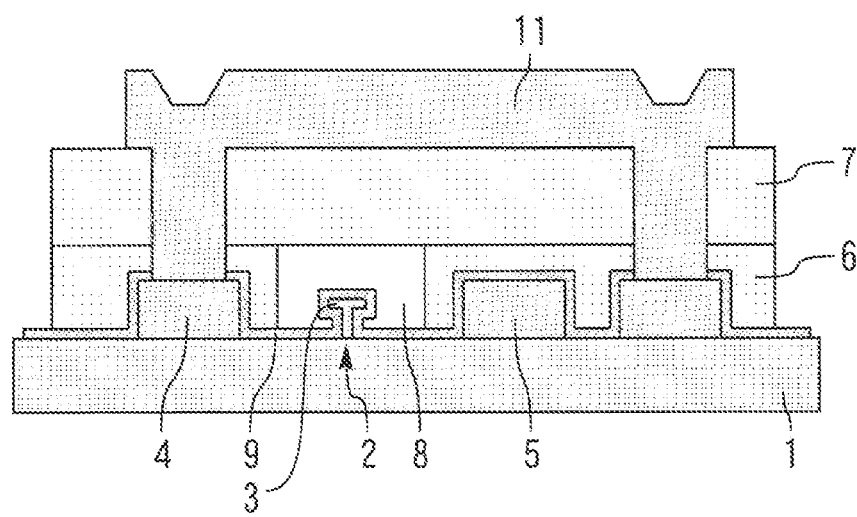

Next, manufacturing steps of the semiconductor device according to the present embodiment will be described. FIGS. 3 to 5 are cross-sectional views illustrating the manufacturing steps of the semiconductor device according to the first embodiment of the present invention. As shown in FIG. 3, the semiconductor element 2 is formed on the main surface of the semiconductor substrate 1 first. The semiconductor element 2 is covered with the first insulating film 9. A photosensitive resin film is formed on the main surface of the semiconductor substrate 1 and the semiconductor element 2 using a lamination method or STP (Spin-coating film Transfer and hot-Pressing technology) method. By patterning the photosensitive resin film through exposure and development, the first resin film 6 that encloses the side of the gate electrode 3 while keeping a distance from the gate electrode 3 of the semiconductor element 2 is formed on the main surface of the semiconductor substrate 1. It is possible to simply form the first resin film 6 using the photosensitive resin film in this way.

Next, as shown in FIG. 4, the hollow structure 8 is formed around the gate electrode 3 of the semiconductor element 2 by bonding the second resin film 7 that covers over the gate electrode 3 while keeping a distance from the gate electrode 3 of the semiconductor element 2 to the top surface of the first resin film 6. More specifically, a photosensitive resin sheet film as the second resin film 7 is bonded to the top surface of the first resin film 6 using a lamination method or STP method. By applying exposure and development to the second resin film 7, through holes are formed above the gate electrode 3 and the source electrode 4. A curing process is then performed to cure the first and second resin films 6 and 7 simultaneously. The curing process may be performed after patterning of the first and second resin films 6 and 7 or the first resin film 6 may be cured before forming the second resin film 7.

Next, as shown in FIG. 5, the gate wiring 10 connected to the gate electrode 3 via the through holes provided in the first and second resin films 6 and 7, and the source wiring 11 connected to the source electrode 4 are formed through plating or vapor deposition. In the case of plating, a power supply layer is formed, patterning is performed using a resist and then electroplating is performed. After that, the resist and the power supply layer are removed. On the other hand, in the case of vapor deposition, patterning is performed using a resist, a metal film is formed through vapor deposition and the resist is removed using a lift-off method. Finally, as shown in FIG. 1, the outside of the first resin film 6 and the outside of the second resin film 7 are covered with the second insulating film 12. However, spaces necessary for contact are kept.

Figure 6:
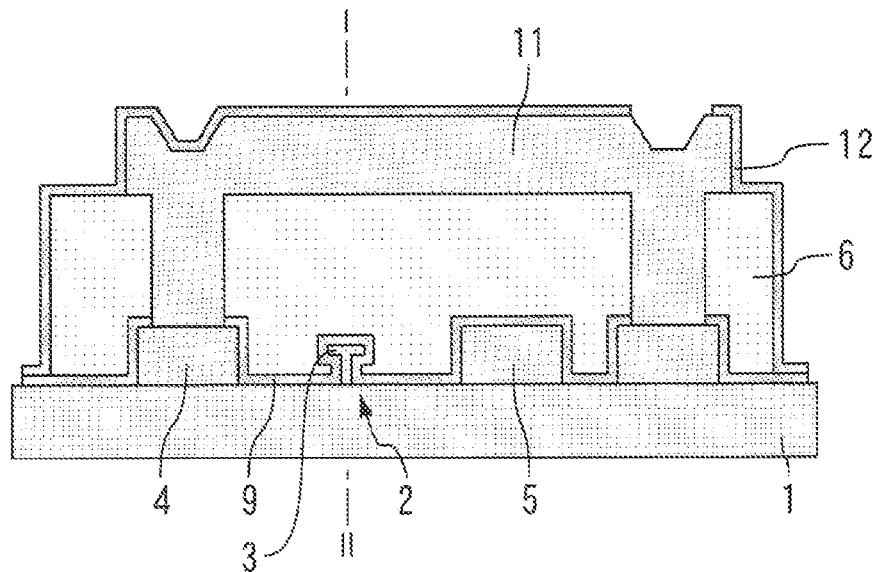
FIG. 6 is a cross-sectional view illustrating a semiconductor device according to a comparative example.
Figure 7:
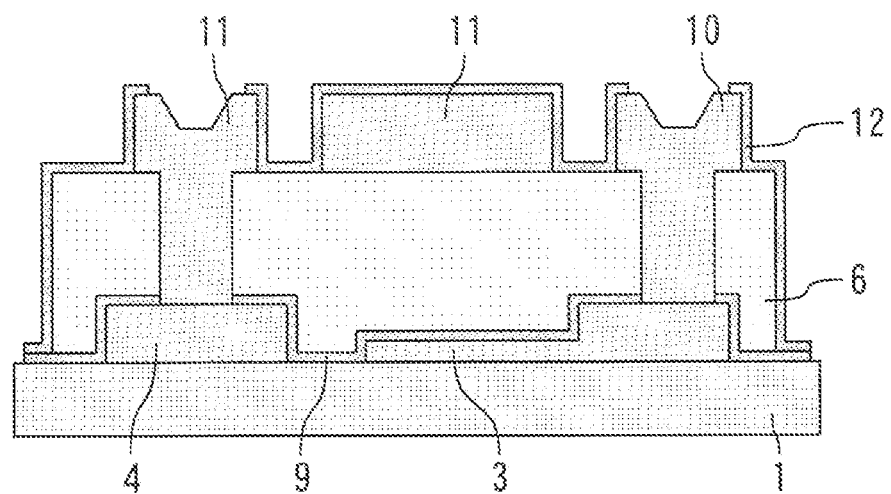
FIG. 7 is a cross-sectional view along I-II in FIG. 6.

Next, effects of the present embodiment will be described in comparison with a comparative example. FIG. 6 is a cross-sectional view illustrating a semiconductor device according to a comparative example and FIG. 7 is a cross-sectional view along I-II in FIG. 6. In the comparative example, no hollow structure 8 is formed, the gate electrode 3 is covered with the first resin film 6 and the space under the overhang of the gate electrode 3 is also filled with the first resin film 6. As a result, the parasitic capacitance increases and electric characteristics such as the high-frequency gain of the semiconductor element 2 deteriorate.

In contrast, in the present embodiment, the hollow structure 8 is formed around the gate electrode 3 of the semiconductor element 2 and the hollow structure 8 is also formed under the overhang of the gate electrode 3. This results in neither increase in parasitic capacitance nor deterioration of electric characteristics of the semiconductor element 2.

Figure 8:
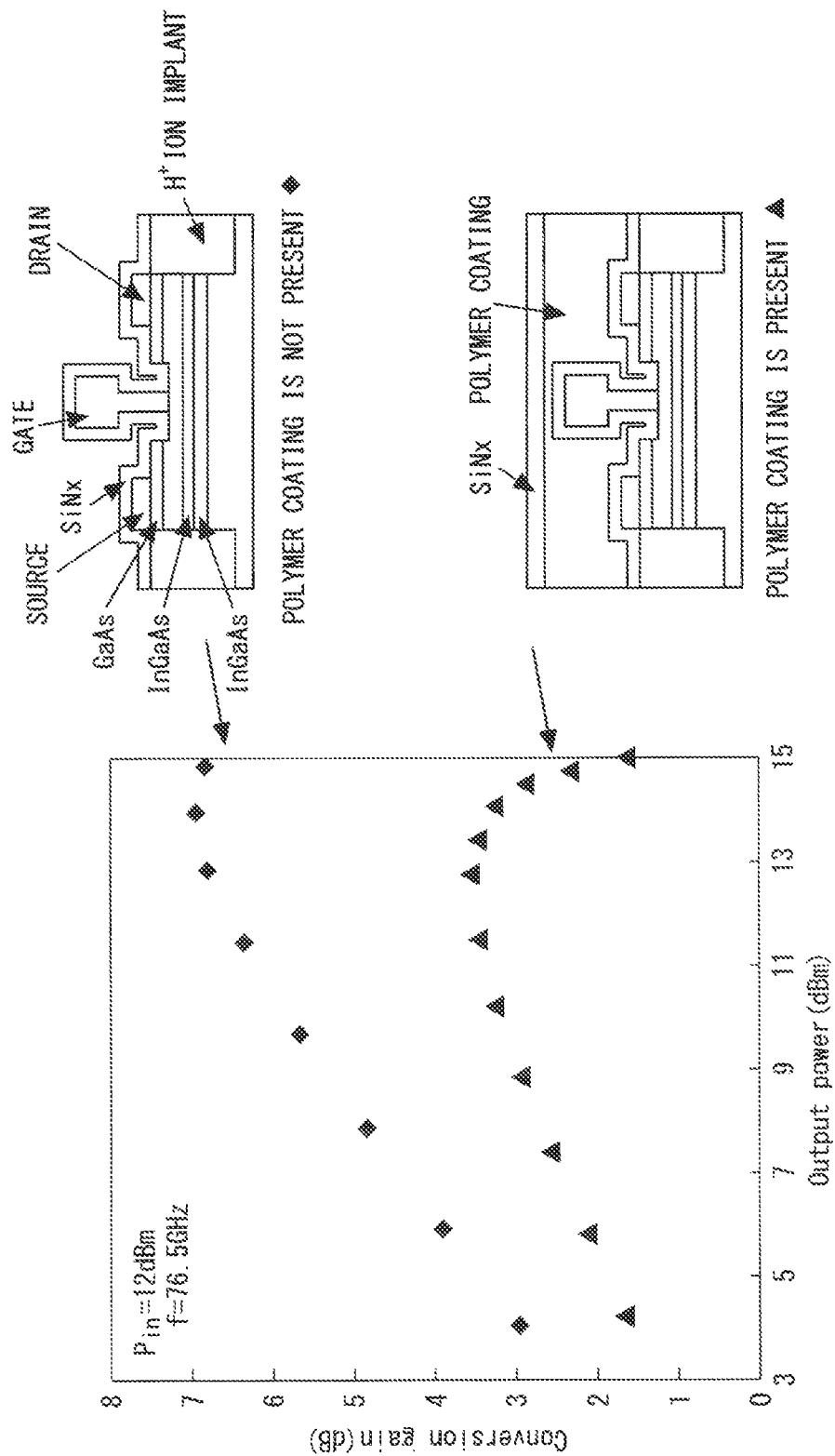
FIG. 8 is a diagram illustrating output dependency of a conversion gain of a transmission amplifier in a 38/77 GHz band.

FIG. 8 is a diagram illustrating output dependency of a conversion gain of a transmission amplifier in a 38/77 GHz band. It is apparent that the conversion gain improves when the semiconductor device is not covered with the resin film compared to when covered with the resin film.

In the present embodiment, since no sacrificial layer is used when the hollow structure 8 is formed around the gate electrode 3 of the semiconductor element 2, there is no cause for concern about etching residue. Therefore, it is possible to prevent parasitic capacitance from increasing.

Furthermore, the first and second resin films 6 and 7 have low humidity resistance and are water absorptive. Thus, by covering the semiconductor element 2 with the first insulating film 9 of high humidity resistance before forming the first and second resin films 6 and 7, it is possible to protect the semiconductor element 2 from the water contained in the first and second resin films 6 and 7. Furthermore, the second insulating film 12 that covers the outside of the first resin film 6 and the outside of the second resin film 7 can protect the semiconductor element 2 from water, physical damage or conductive foreign substances.

Second Embodiment

Figure 9:
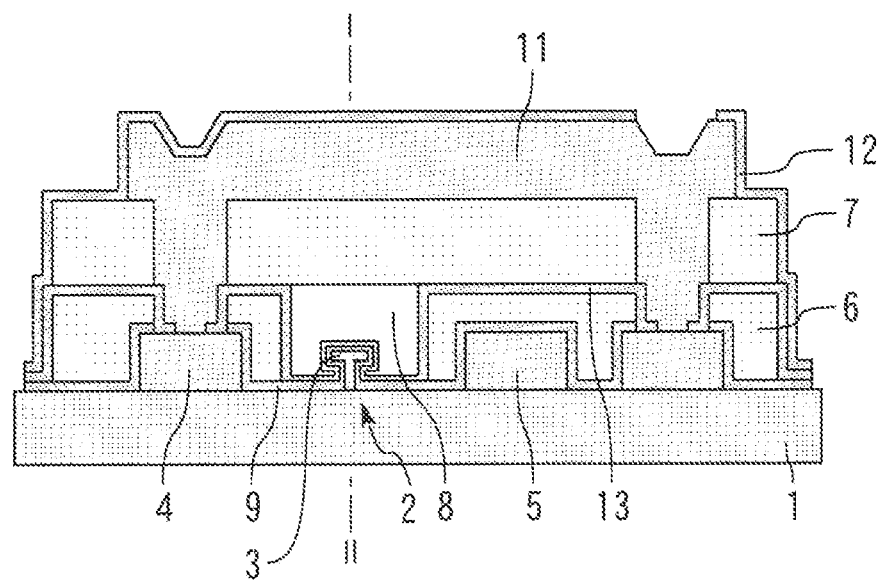
FIG. 9 is a cross-sectional view illustrating a semiconductor device according to a second embodiment of the present invention.
Figure 10:
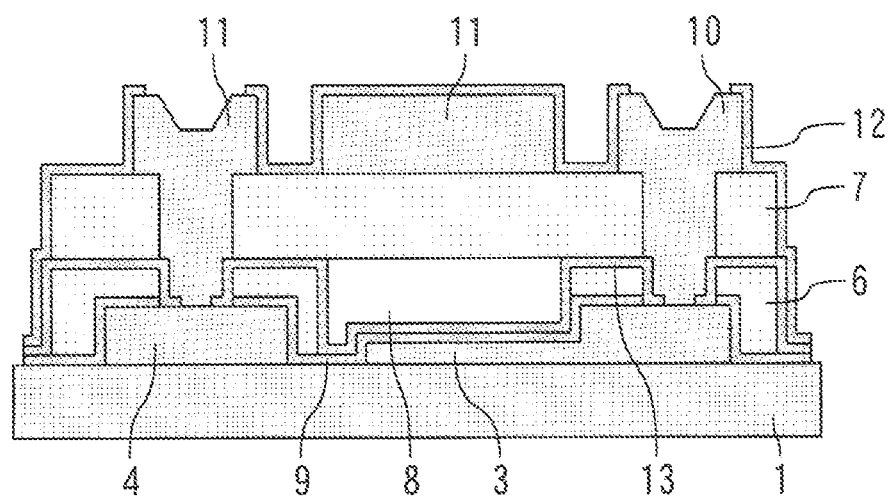
FIG. 10 is a cross-sectional view along I-II in FIG. 9.

FIG. 9 is a cross-sectional view illustrating a semiconductor device according to a second embodiment of the present invention. FIG. 10 is a cross-sectional view along I-II in FIG. 9. A third insulating film 13 is formed on the top surface of the first resin film 6 and the second resin film 7 is bonded to the top surface of the first resin film 6 via the third insulating film 13. The adherence between the first or second resin film 6 or 7 and the third insulating film 13 is greater than the adherence between the first resin film 6 and the second resin film 7. The third insulating film 13 is made of, for example, SiN or SiON. Although the adherence between the first resin film 6 and the second resin film 7 is small, the adherence can be increased by providing the third insulating film 13 between the two. The third insulating film 13 further improves humidity resistance. The rest of the configuration and other effects are similar to those of the first embodiment.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-162933, filed on Aug. 8, 2014 including specification, claims, drawings and summary, on which the Convention priority of the present application is based, is incorporated herein by reference in its entirety.

What is claimed is:

1. A method for manufacturing a semiconductor device comprising:
   forming a semiconductor element having an electrode on a main surface of a semiconductor substrate;
   forming a first resin film that encloses a side of the electrode while keeping a distance from the electrode of the semiconductor element on the main surface of the semiconductor substrate;
   forming a hollow structure around the electrode of the semiconductor element by bonding a second resin film that covers over the electrode while keeping a distance from the electrode of the semiconductor element to a top surface of the first resin film; and
   covering the semiconductor element with a first insulating film having higher moisture resistance than the first and second resin films before forming the first and second resin films.

2. The method for manufacturing the semiconductor device according to claim 1, wherein the electrode of the semiconductor element is a Y-type or T-type gate electrode including an overhang, and
   the hollow structure is formed under the overhang of the gate electrode.

3. The method for manufacturing the semiconductor device according to claim 1, wherein a resin sheet film as the second resin film is bonded to the top surface of the first resin film using a lamination method or STP (Spin-coating film Transfer and hot-Pressing technology) method.

4. The method for manufacturing the semiconductor device according to claim 1, further comprising:
   forming a photosensitive resin film on the main surface of the semiconductor substrate and the semiconductor element; and
   forming the first resin film by patterning the photosensitive resin film through exposure and development.

5. The method for manufacturing the semiconductor device according to claim 1, further comprising covering outsides of the first and second resin films with a second insulating film having higher moisture resistance than the first and second resin films.

6. The method for manufacturing the semiconductor device according to claim 1, further comprising forming a third insulating film on the top surface of the first resin film,
   wherein the second resin film is bonded to the top surface of the first resin film via the third insulating film, and
   an adherence between the first and second resin films and the third insulating film is greater than an adherence between the first resin film and the second resin film.

7. A method for manufacturing a semiconductor device comprising:
   forming a semiconductor element having an electrode on a main surface of a semiconductor substrate;
   forming a first resin film that encloses a side of the electrode while keeping a distance from the electrode of the semiconductor element on the main surface of the semiconductor substrate;
   forming a hollow structure around the electrode of the semiconductor element by bonding a second resin film that covers over the electrode while keeping a distance from the electrode of the semiconductor element to a top surface of the first resin film; and
   forming a third insulating film on the top surface of the first resin film,
   wherein the second resin film is bonded to the top surface of the first resin film via the third insulating film, and
   an adherence between the first and second resin films and the third insulating film is greater than an adherence between the first resin film and the second resin film.

8. The method for manufacturing the semiconductor device according to claim 7, wherein the electrode of the semiconductor element is a Y-type or T-type gate electrode including an overhang, and
   the hollow structure is formed under the overhang of the gate electrode.

9. The method for manufacturing the semiconductor device according to claim 7, wherein a resin sheet film as the second resin film is bonded to the top surface of the first resin film using a lamination method or STP (Spin-coating film Transfer and hot-Pressing technology) method.

10. The method for manufacturing the semiconductor device according to claim 7, further comprising:
    forming a photosensitive resin film on the main surface of the semiconductor substrate and the semiconductor element; and
    forming the first resin film by patterning the photosensitive resin film through exposure and development.

11. The method for manufacturing the semiconductor device according to claim 7, further comprising covering outsides of the first and second resin films with a second insulating film having higher moisture resistance than the first and second resin films.

* * * * *